United States Patent [19]
Schreiber et al.

[11] Patent Number: 5,233,157
[45] Date of Patent: Aug. 3, 1993

[54] LASER PATTERN ABLATION OF FINE LINE CIRCUITRY MASTERS

[75] Inventors: Christopher M. Schreiber, Newport Beach; William R. Crumly, Anaheim, both of Calif.

[73] Assignee: Hughes Aircraft Company, Los Angeles, Calif.

[21] Appl. No.: 580,749

[22] Filed: Sep. 11, 1990

[51] Int. Cl.$^5$ .......................................... B23K 26/00
[52] U.S. Cl. .............................................. 219/121.68
[58] Field of Search ................... 219/121.68, 121.69, 219/121.6; 156/643

[56] References Cited

U.S. PATENT DOCUMENTS

| | | | |
|---|---|---|---|
| 4,489,230 | 12/1984 | Yamamoto | 219/121.85 |
| 4,535,220 | 8/1985 | Cullis et al. | 219/121.85 |
| 4,694,138 | 9/1987 | Oodaira et al. | 219/121.85 |

*Primary Examiner*—C. L. Albritton
*Attorney, Agent, or Firm*—Elizabeth E. Leitereg; Terje Gudmestad; W. K. Denson-Low

[57] ABSTRACT

A fine line electrical circuit having precise rectangular conductor cross-sections (70) is electroformed on a patterned laser ablated mandrel (32,34). The mandrel comprises a stainless steel substrate (32) coated with a layer of Teflon (34). An eximer laser (44,56) is caused to project a fine spot (54) upon the Teflon (34) with a power sufficient to ablate the Teflon (34) entirely through to the stainless steel substrate (32). A software program drives the coated mandrel beneath the laser beam in an X-Y pattern that defines the pattern of a circuit to be produced, thereby exposing the conductive surface of the mandrel in the selected pattern. A pattern of conductors (70) is then plated upon the mandrel, a dielectric substrate (76) is laminated upon the mandrel and upon the pattern of conductors and then the dielectric substrate (76), together with the conductors (70) adhering thereto, is separated from the mandrel.

4 Claims, 2 Drawing Sheets

LASER PATTERN ABLATION OF FINE LINE CIRCUITRY MASTERS

BACKGROUND OF THE INVENTION

Printed electrical circuits, including both rigid and flexible circuits, generally comprise a pattern of electrical conductors or conductive traces carried by and bonded to a dielectric substrate. Printed circuitry at present, whether flexible or formed on a relatively rigid board, is made by well known photolithographic and etching processes (Print & Etch). Conventional steps employed in such processes include covering a dielectric substrate with a coat of conductive material, such as copper, which will form the traces of the circuit, and then coating the copper with a photosensitive etch resist. Art work in the form of a mask having a pattern of optically opaque and optically transparent portions formed therein is applied over the resist, and the latter is then optically exposed through the mask so that portions of the resist which have been exposed to light may be developed. Those portions of the resist which have not been exposed and developed are then removed to leave a positive pattern of resist on the copper surface. The assembly of substrate, copper and positive pattern of resist is then subjected to etching fluids which do not affect the resist but which remove the copper in areas not covered by the resist. The developed resist is then stripped to provide the desired pattern of copper conductors or traces bonded to the dielectric substrate.

Conventional etched circuit processes have a number of disadvantages. Dimensional precision of the etched circuit is difficult to achieve. The use of various etching, stripping and cleaning fluids require special handling of hazardous chemicals. Techniques for disposal of the resulting effluents are complex and expensive and subject to strict government controls. Etched circuit processing may have a relatively low yield, greatly increasing the cost of the processing which inherently involves a large number of costly processing steps.

Still other problems exist in certain applications. A significant problem in etching of fine line features is the difficulty of obtaining desired precision of fine geometry of the etched traces and, in particular, the difficulty of obtaining traces of a precise rectangular cross-sectional configuration. This problem of trace cross-section is caused by lateral etch. Lateral etch occurs because the etching fluid acts in all directions and not only removes metal downwardly, but removes metal to the sides of the exposed area. Lateral or sideways etch can be expressed as the amount of etching under a resist pattern when the surface is etched. Etch factor has been defined as the depth of etch divided by the amount of sideways growth when a material is etched. It is calculated from one edge of an etched area only. Thus, an etch factor of 2 means that the depth of etch in a material is twice as large as the undercutting of the resist edge. For those traces that are etched on two sides, the total lateral etch and thus the total decrease in width of the line is doubled. Moreover, the surface of the etch is not straight, but is curved in a manner that is difficult to precisely predetermine. Frequently a series of tests must be run to determine the amount and nature of the lateral etch. The etching artwork or masking must be compensated for empirically determined lateral etch. Complex compensatory arrangements have been followed to attempt to obtain straight, smooth conductor walls and to minimize the amount of inclination of the resulting trapezoidal cross-sectioned conductors.

Still another dimensional limitation of the etching process is its limited resolution. Using conventional etching processes, a minimum width of trace is on the order of 4 to 5 mils which may be inadequate because desired circuit components are continuously decreasing in size and increasing in density, thereby requiring higher and higher resolution.

Electrical circuits of higher frequency and speed require transmission lines capable of providing signals with matched impedance. The characteristic impedance of a circuit is determined by the dielectric constant of the insulation and geometries and spatial distribution of ground and signal lines. These more stringent requirements of geometry and spatial distribution are extremely difficult if not impossible to meet using conventional etching processes.

Accordingly, it is an object of the present invention to provide methods and apparatus that avoid or minimize above mentioned problems.

SUMMARY OF THE INVENTION

In carrying out principles of the present invention in accordance with a preferred embodiment thereof, there is provided a mandrel comprising an electrically conductive substrate having a surface coated with an electrically non-conductive material and an ablated pattern of fine grooves formed in the non-conductive material, extending entirely through the material to the substrate. The ablated grooves have a substantially rectangular, precisely dimensioned cross-section. The fine groove pattern is preferably formed by directing a focused beam of laser light at a very small area of the non-conductive coating with a power sufficient to ablate the coating through its entire thickness, and then relatively moving the laser beam and the non-conductive coating in a pattern defining the desired circuit pattern. This procedure produces an ablated pattern of fine grooves in the mandrel coating which expose the electrically conductive mandrel substrate surface in the desired circuit pattern. The grooves have a width precisely defined by the area of the impinging laser beam, which may be very small, and have straight side walls, precisely parallel to the beam axis. The mandrel with its ablated pattern of grooves then has a pattern of electrical conductors or circuit traces electroformed or electrodeposited thereon by electrolytic, electroless or equivalent deposition. A suitable dielectric substrate is then laminated on the mandrel and bonded to the electroformed conductive traces so that the dielectric substrate together with the traces bonded thereto may be separated from the mandrel and its non-conductive coating.

DESCRIPTION OF PREFERRED EMBODIMENT

Figure 1:
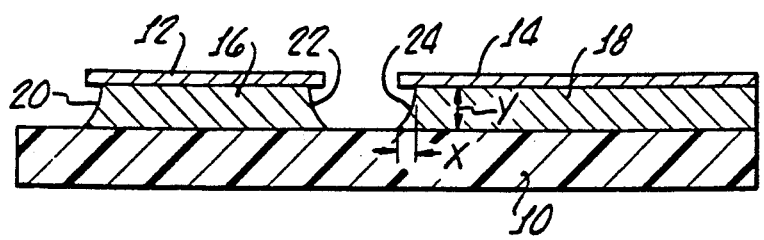
FIG. 1 illustrates certain aspects of prior art etching processes.

As illustrated in FIG. 1, conventional etching processes typically comprise the use of a non-conductive substrate 10 to which is laminated a continuous layer of conductive material, such as copper, which is to form the traces or conductors of the finished circuit. The copper layer is then coated with a resist which is then optically exposed through a mask and developed to leave remaining resist areas indicated at 12 and 14 in FIG. 1. The developed resist defines a positive pattern and the assembly is then subjected to an etching fluid that removes the copper that is not protected by developed resist. However, because of the lateral or sideways etch, copper leads such as those indicated at 16 and 18 in FIG. 1 are etched in somewhat trapezoidal configurations, having inclined and curved side walls such as indicated at 20, 22, and 24. As previously noted, dimensions and shape of this trapezoidal cross-sectional configuration of the resulting leads are difficult to precisely predetermine. Further, this configuration is generally much less desirable than a precisely defined rectangular cross-section. In FIG. 1, the etch factor is the ratio of Y to X. Because of the magnitude of the etch factor of the lateral etching characteristics of the etching process, it is difficult to make a relatively tall and narrow lead so that, for example, the maximum ratio of height of the lead to its width may be no more than about 1:1, whereas for some circuits it is desired to have a relative tall and narrow cross-section of as much as 1.5 or 2:1, or more. Processes of the present invention, however, enable additive forming of features having a height to width ratio of more than 1.5:1.

The present invention not only avoids the geometry and dimensional problems of the prior art etching process, but enables considerably finer resolution. At the same time, the invention entirely eliminates all of the etching processes, and attendant problems, from the circuit manufacturing steps. According to one aspect of the invention, a circuit master or mandrel is formed by ablating a selected circuit pattern through a non-conductive coating on a conductive mandrel, and the circuit is completely additively formed on the exposed conductive mandrel surfaces.

The circuitry to be formed on the mandrel may be made by fully additive electroforming techniques described in co-pending application Ser. No. 580,758, filed Sep. 11, 1990 of Crumley, Schreiber, and Feigenbaum for Three-Dimensional Electroformed Interconnection Circuity, and application Ser. No. 580,748, filed Sep. 11, 1990, of Souto and Schreiber, for Apparatus and Method for Using a Permanent Mandrel for Manufacture of Electrical Circuitry, both of which applications are assigned to the assignee of the present application. The disclosures of both of said co-pending applications are incorporated by this reference as though fully set forth herein.

Figure 2:
FIGS. 2 through 7 are cross sectional views that illustrate successive steps in the fabrication of an electrical circuit according to one embodiment of the disclosed invention.
Figure 3:
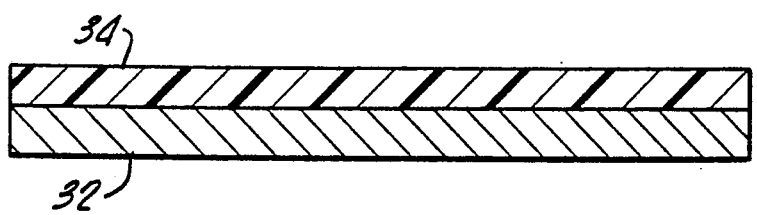

As can be seen in FIG. 2, a mandrel substrate 32 is formed comprising a sheet of conductive material such as, for example, a stainless steel plate having suitable horizontal dimensions and having a thickness in the order of about 1/16-inch. The plate is polished to a very smooth finish such as a 4 m finish and then, as indicated in FIG. 3, a coating of a suitable non-conductive material such as, for example, Teflon, is conventionally applied and bonded to the surface of the stainless steel mandrel substrate. The non-conductive coating has a thickness equal to the height of the desired conductive traces that are to be formed in the finished electrical circuit. Alternatively, the mandrel substrate may be made of any suitable material covered with an electrically conductive coating, and then coating the conductive coating with Teflon.

Figure 4:
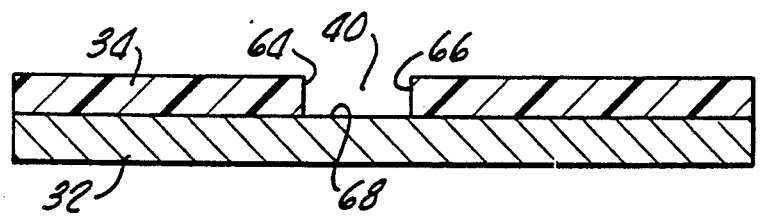

Thereafter, as indicated in FIG. 4, a pattern of grooves such as groove 40 is formed in the Teflon layer 34 by laser ablation.

Figure 8:
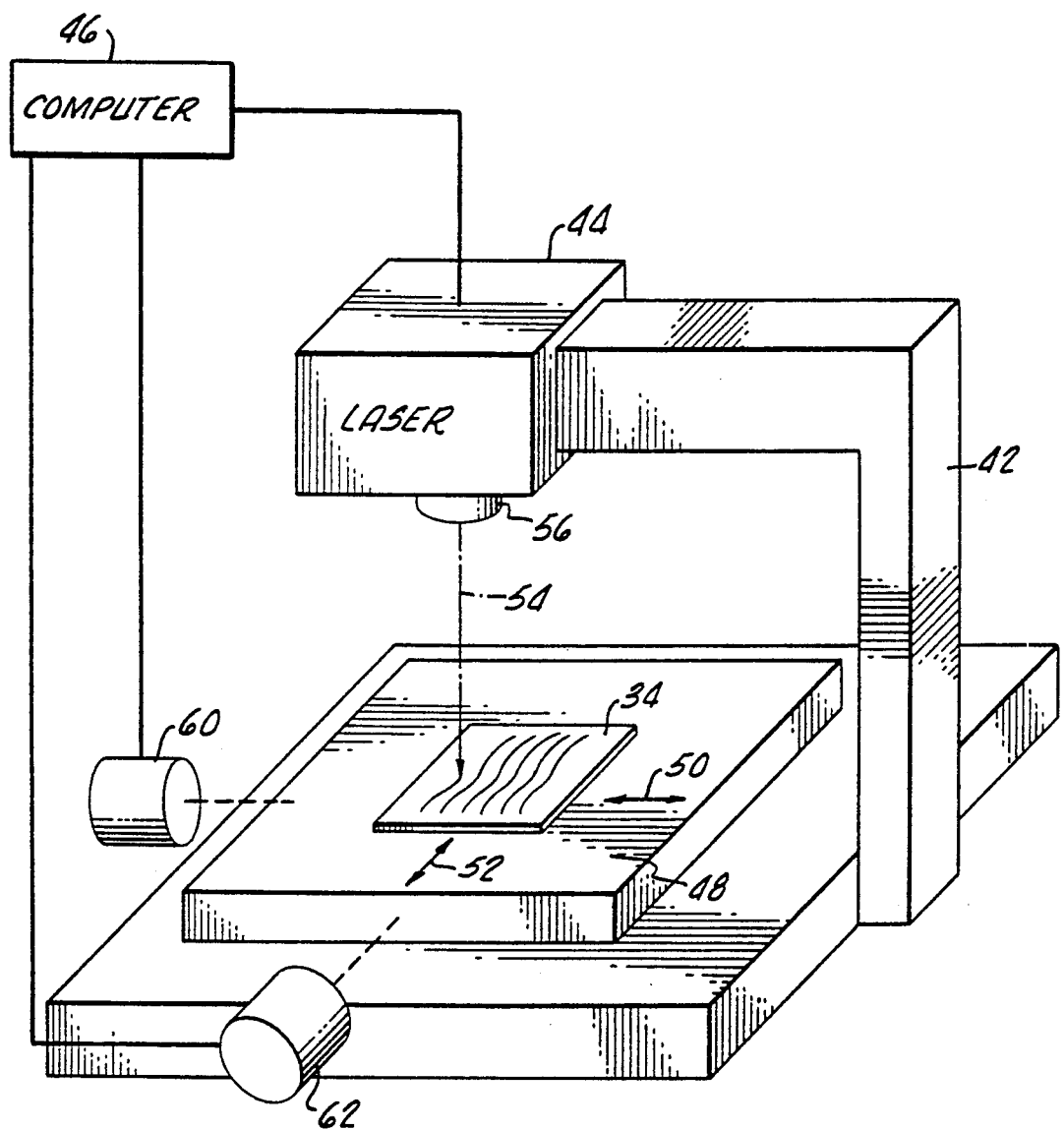
FIG. 8 illustrates use of a laser for ablating a pattern in the mandrel.

FIG. 8 illustrates a simplified schematic arrangement of an exemplary apparatus for performing laser ablation of the pattern of grooves 40. A support 42 carries an eximer laser 44 that is controlled by a suitable software program provided from a computer 46. The laser is mounted above a work table 48 that itself is mounted for two dimensional horizontal motion relative to the support in the directions of arrows 50 and 52, for example. The partially formed mandrel, in the state illustrated in FIG. 3, is securely mounted upon the table 48, and the laser beam 54, through suitable optics 56, is focused upon the surface of the Teflon coating 34. Table 48 is driven in the desired pattern by means of motors 60, 62 controlled from computer 46.

The laser employed is preferably an eximer laser emitting laser pulses of a 248 nanometer (nm) wavelength having a duration of a few nanoseconds each. The laser is focused so as to provide a substantially parallel (collimated) beam of exceedingly small dimensions at the surface of the Teflon 34. The laser can be focused down to a spot as small as one-half mil in diameter and, thus, the described apparatus is capable of ablating the Teflon to form grooves having a width of three mils or less and as small as one-half mil. The grooves ablated by the laser extend entirely through the Teflon coating to expose the conductive surface of the stainless steel substrate 32. The depth of the ablated grooves is determined by the thickness of the Teflon coating which may be readily increased to provide grooves having greater depth.

Having completed the program controlled X-Y traverse of the ablating laser beam over the mandrel and its Teflon coating, the completed mandrel is in the state illustrated in FIG. 4. It has a desired pattern of grooves 40, with walls 64, 66 of the grooves being substantially perpendicular to the exposed conductive surface 68 of the mandrel substrate. Walls 64, 66 of the grooves 40 are parallel to one another and to the axis of the laser beam 54 which itself is positioned to be perpendicular to the surface of the mandrel, thereby forming a groove 40 of precisely rectangular configuration, and of precisely predetermined dimensions, with high resolution.

If deemed necessary or desirable, the exposed mandrel substrate surfaces 68 may now be treated to promote release of the conductive traces that are to be additively electroformed in the grooves. The surface of the Teflon itself provides for ready release of a dielectric substrate to be laminated on the mandrel but, if deemed necessary or desirable, may be further treated to promote such release.

Figure 5:
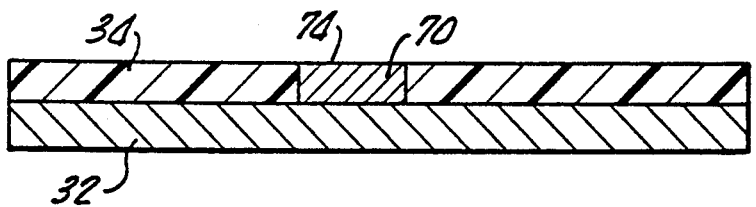

Thereafter, as illustrated in FIG. 5, a pattern of conductors 70 formed of a suitable electrically conductive material, such as copper or nickel or the like, is then electroformed or electrodeposited upon the mandrel. Conveniently this may be achieved by conventional electrolytic deposition. Other additive electroforming processes such as electroless, electrophoretic or electrostatic plating or deposition may be employed to deposit the pattern of conductors 70 upon the mandrel.

Now, if deemed necessary or desirable, the exposed surface 74 of conductors 70 is suitably treated to promote bonding to a substrate that is to be laminated thereon. The conductors at this stage of the process, being firmly supported upon the relatively rigid and substantial mandrel, are more readily handled for such surface treatment process while they are on the mandrel. The substrate of stainless steel or a nickel substrate inherently passivates itself for ready release of the plated copper, or may be treated to promote such release if other substrate materials are used.

Figure 6:
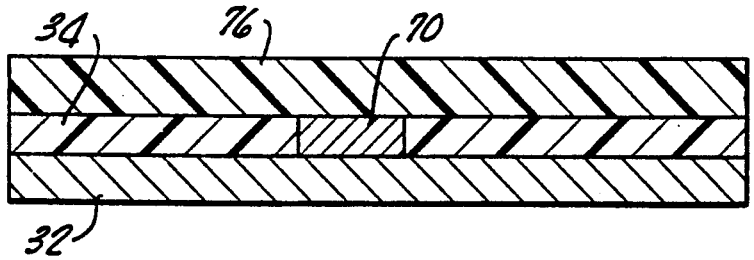

Now a suitable dielectric substrate 76 (FIG. 6) may be laminated to the surface of the mandrel, covering both the pattern of conductors 70 and the Teflon coating 34. The dielectric substrate 76 may be formed of any one of a number of different well known materials. These include polyimides, polyimide layered with acrylic adhesive, polyethylene, polyester and vinyl. For example, a suitable dielectric would comprise a 1 mil layer of a polyimide known as Kapton covered with a 1 or 2 mil layer of acrylic adhesive. The dielectric substrate is laminated upon the mandrel and the plated conductors under a pressure of about 300 psi and at a temperature of about 370° F. At these pressures and temperatures, the acrylic adhesive flows and enters the microstructure in the deposited conductors, and ensures adhesion of the dielectric substrate to the conductors.

Figure 7:
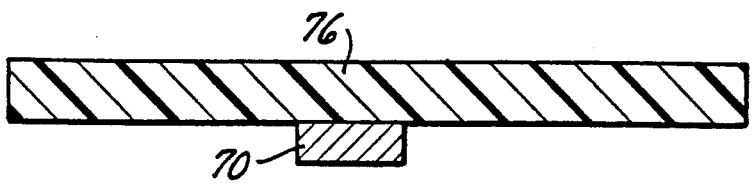

Now a knife edge or the like may be inserted between the dielectric and the coated mandrel to lift the substrate, together with the conductive traces 70 bonded thereto, from the mandrel. Either the substrate or the mandrel or both may be made sufficiently flexible as to facilitate such peeling-type separation, although both may be rigid. The resulting circuit, illustrated in FIG. 7, comprises the substrate 76 on the surface of which is formed and bonded a pattern of electrically conductive traces 70 of precisely rectangular cross section, precisely predetermined dimensions and high resolution.

Although the mandrel and processing techniques employed therewith are uniquely adapted for improved manufacture of electrical circuitry, it will be readily appreciated that the described mandrel can be employed for manufacture of other devices requiring fine features of high resolution and precision geometries. Examples of the many different types non-electrical or other devices that can be made on this mandrel include fine wire coils formed on the outside of a cylindrical mandrel, fine screens, and waveguides with internal ribs wherein the mandrel is a rectangular bar having a pattern of wave guide interior ribs ablated on the mandrel exterior surface, with the mandrel then being dissolved away after electroforming the wave guide on the mandrel.

When applied to manufacture of electrical circuitry, the reusable master or mandrel enables manufacture of electrical circuitry by fully additive electrodeposition or electroforming processes, allows more precise control of lines and spaces on the circuit, and completely eliminates conventional photo-etching and stripping operations, as well as the consumption of chemicals and disposal of spent effluents from such processes. By eliminating photodeveloping, etching and stripping operations, the described additive processes require many fewer process steps than conventional printing and etching processes. Thus, costs of manufacture of the resulting parts may be dramatically reduced and volume of output product greatly increased. The described method of circuit fabrication is considerably more efficient and provides a circuit free from inherent distortions of conventional subtractive processes caused by the CTE mismatch between dielectric and copper that is etched away. The master or mandrel is a reusable device that will provide a product free from conventional defects. Furthermore, environmental control is not as critical as in photo-lithographic (etching) processes in that the described fully additive process can produce circuit features in a relatively inexpensive, easy to maintain plating shop environment, which features would otherwise require an expensive class 10,000 clean room if formed by conventional photolithographic processes. The finished mandrel is readily recleaned for reuse and manufacture of additional circuits.

Whereas some etched circuits of the prior art employ rolled copper plate that is etched to form conductors, the process as described herein employs plated copper or other conductors which provide conductors of higher yield strength than rolled copper plate. The process described herein, having its pattern controlled by software that directs the traverse of the mandrel beneath the laser beam can be readily changed to provide a different pattern and a different circuit without the necessity of designing and manufacturing new artwork and masks.

What is claimed:

1. Apparatus for use in the manufacture of an electrical circuit comprising:

a mandrel having an electrically conductive surface for electroforming an electrically conductive material thereon, and a protective coating resistant to electroforming formed on said surface and having a pattern of grooves defined therein, said grooves extending through said coating to expose said surface and defining a pattern of conductors of said electrical circuit, said grooves having walls that are substantially perpendicular to said mandrel, wherein upon electroforming said electrically conductive material to said mandrel, said material is deposited on said surface within said grooves to form said conductors, said conductors being adapted to be laminated with a dielectric substrate that forms a substrate of said electrical circuit, and being removable with said laminated dielectric substrate as said manufactured electrical circuit.

2. The apparatus of claim 1 wherein the mandrel is formed of an electrically-conductive material, and wherein said protective coating is electrically nonconductive.

3. The apparatus of claim 1 wherein said pattern of grooves is a laser ablated pattern defining grooves of substantially rectangular cross section.

4. The apparatus of claim 1 wherein said grooves have sidewalls that meet the surface of said mandrel at substantially right angles and are free of undercut.

* * * * *